United States Patent [19]

Phy

[11] Patent Number: 4,515,662
[45] Date of Patent: May 7, 1985

[54] PROCESS FOR FABRICATING PRECISION OPTICAL SPACERS FOR IMAGE SENSOR FILTERS

[75] Inventor: William S. Phy, Los Altos Hill, Calif.

[73] Assignee: Fairchild Camera & Instrument Corporation, Mountain View, Calif.

[21] Appl. No.: 464,187

[22] Filed: Feb. 7, 1983

Related U.S. Application Data

[62] Division of Ser. No. 233,347, Feb. 11, 1981, Pat. No. 4,388,525.

[51] Int. Cl.³ .............................................. C25D 5/02
[52] U.S. Cl. .................................... 204/15; 204/38.4
[58] Field of Search .................... 204/15, 38 B, 38 R, 204/38.4

[56] References Cited

U.S. PATENT DOCUMENTS 3,745,094 7/1973 Greene .................................. 204/15
4,315,985 2/1982 Castellani ............................. 204/15

Primary Examiner—Thomas Tufariello
Attorney, Agent, or Firm—Kenneth Olsen; Carl L. Silverman; Ronald C. Fish

[57] ABSTRACT

A process is described for fabricating spacers of a desired thickness of filters, the spacers to be used in separating the filter from an underlying image sensing device. The process includes the steps of forming a pattern of electrically conductive material on one surface of the filter, depositing dry resist to the desired thickness over all of the filter except on the electrically conductive pattern, depositing additional electrically conductive material on at least the electrically conductive pattern, and removing the dry resist.

14 Claims, 10 Drawing Figures

PROCESS FOR FABRICATING PRECISION OPTICAL SPACERS FOR IMAGE SENSOR FILTERS

This is a division of application Ser. No. 233,347, filed Feb. 11, 1981, now U.S. Pat. No. 4,388,525.

BACKGROUND OF THE INVENTION

1. Field of the Invention

This invention relates to packages for integrated circuits, and in particular a process and the resulting structure for fabricating precision optical spacers of desired thickness to separate a window or filter from an image sensor such as a charged coupled device.

2. Brief Description of the Prior Art

Several techniques have been used to fabricate a precision optical spacer for separating an image sensing device from a filter or window. One prior art technique has been to utilize mechanical spacers, for example, precision machined material, to dispose between the image sensor and the overlying filter or window. Such techniques have typically been expensive, difficult to fabricate in applications where very thin spacers are required, and difficult to handle and align.

Another prior art technique has been to deposit metal or other material directly on the surface of the integrated circuit and attempt to form the material to the desired thickness. Such techniques require several extra masks during the fabrication of the image sensor or other integrated circuit, resulting in a lower overall yield. Additionally, such techniques make back lapping the substrate on which the integrated circuit or image sensor is formed difficult, and frequently result in cracking of the sensor during back lapping.

A third prior art approach has been to design precision packages for containing the image sensor. Such packages typically require extremely careful manufacturing processes, with accordingly high cost.

SUMMARY OF THE INVENTION

The process and resulting structure of this invention overcome the disadvantages of the prior art processes and structures. In particular, the process of this invention, by fabricating the spacing device directly on the window or filter, does not require precision manufactured mechanical spacers or precision packages. The difficulties of depositing metal or other material on the underlying image sensing device are also eliminated. In one embodiment a process for fabricating spacers of desired thickness for a filter to be used in separating the filter from an underlying integrated circuit structure comprises the steps of: forming a pattern of electrically conductive material on one surface of the filter, the electrically conductive materail being substantially thinner than the desired thickness; depositing selected material over all of the filter except on the electrically conductive material, the selected material being deposited to substantially the desired thickness; depositing additional electrically conductive material on at least the pattern of electrically conductive material; and removing the selected material.

In another embodiment a package for an image sensing device comprises: a filter, an image sensing device including bonding pads; an electrically conductive pattern disposed on the filter and separating the filter from the image sensing device, the pattern disposed on the filter being nowhere in contact with the bonding pads.

DETAILED DESCRIPTION

Figure 1:
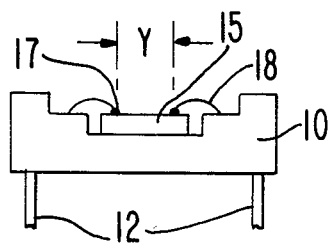
FIG. 1 is a cross-sectional view of an integrated circuit package showing an image sensor chip and associated bonding pads.

FIG. 1 is a cross-sectional view of a typical integrated circuit package showing the substrate 10, a portion of electrically connecting pins 12, integrated circuit 15, bonding pads 17 and bonding wires 18. It is an object of this invention to provide a process for fabricating a structure to enable attaching a window or filter to the upper surface of circuit 15 at a precise spacing above the upper surface of circuit 15. In the preferred embodiment circuit 15 will be an image sensing device, for example a charge coupled device.

Figure 2:
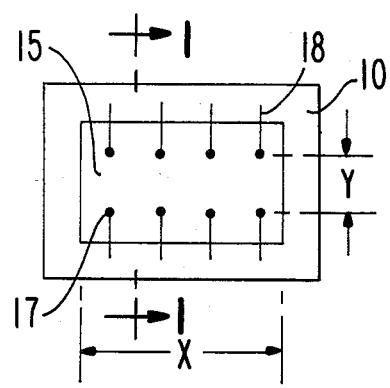
FIG. 2 is a top view of the structure shown in FIG. 1.

FIG. 2 is a top view of the structure shown in FIG. 1 with corresponding portions given corresponding designations. For purposes of explanation of the invention it is assumed that a window or filter having length X and width Y is desired to be disposed parallel to image sensor 15 and at a fixed spacing away from sensor 15. It is further assumed that the filter or window to be disposed above circuit 15 is not to contact the semiconductor surface. Contact with the semiconductor surface is particularly undesirable in conjunction with charge coupled devices which are known to be extremely surface sensitive.

Figure 3:
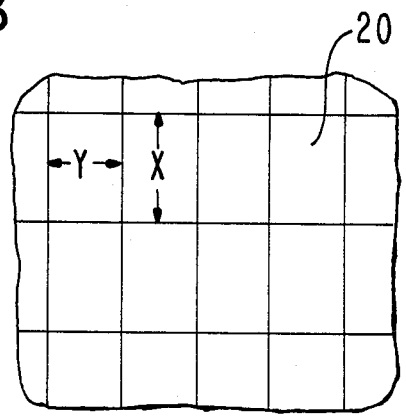
FIG. 3 depicts an array of filters, each one of which is to be disposed over a single imaging sensing device.

FIG. 3 shows an array of window or filter planforms chosen which have dimensions which fall within the bonding pad region of the circuit shown in FIG. 2. The array of windows or filters 20 will be an appropriate multiple of the X and Y dimensions such that a multiplicity of filters 20 may be processed simultaneously. The convenient multiple may be chosen depending upon the dimensions of the process equipment used. As used herein, the terms filter and window are intended to be interchangeable. The terms are intended to refer to any piece of material which is desired to be disposed a fixed distance from an underlying integrated circuit or image sensor.

Figure 4:
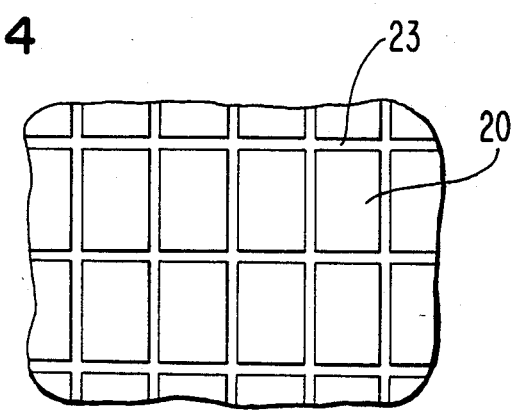
FIG. 4 depicts the array of FIG. 3 after an electrically conductive grid has been formed.
Figure 5:
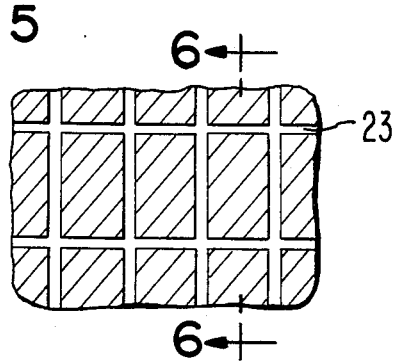
FIG. 5 depicts the array of FIG. 4 after deposition of a pattern of selected material and further deposition of electrically conductive material.

Next, as shown in FIG. 4 an adherent electrically conductive pattern 23 is formed on the surface of the array of filters 20. The adherent electrically conductive coating may be any desired coating. In the preferred embodiment layers or films of chromium with copper and chromium with gold have been found suitable. The metal is typically deposited to a thickness of approximately 5000 to 10,000 angstroms, for example using evaporation or sputtering techniques. The pattern may be defined using any suitable method, for example, well known photolithographic masking techniques in conjunction with photoresist and etching processes, or resist lifting techniques. It is essential, however, that the metal pattern 23 be fabricated using a platable metal.

After the metal grid 23 has been formed, a layer of dry film resist, for example, Riston manufactured by Dow Chemical Corporation, is deposited everywhere on each filter 20 except where the grid pattern 23 is formed. The dry resist is deposited to whatever thickness is desired for the separation between filter 20 and integrated circuit 15. In the preferred embodiment in conjunction with a charge coupled device, resist 25 will be approximately 0.5 to 1.0 mils thick.

Figure 6:
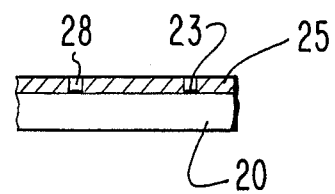
FIG. 6 is a cross-sectional view of the structure shown in FIG. 5.

As also shown in FIG. 6, the grid 23 is electroplated to thicken the electrically conductive pattern to the desired thickness of the resist 25. The relatively uniform field created by grid 23 helps ensure a uniform current density, and thereby ensure that additionally deposited conductive material 28 will be substantially as thick as resist 25. We have discovered that the resist 25 has a self-limiting effect on the thickness of plating 28. That is, plating 28 will virtually stop when it reaches a thickness corresponding to the thickness of resist 25.

Figure 7:
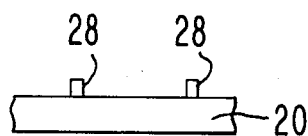
FIG. 7 is a subsequent cross-sectional view after removal of the selected material from the structure of FIG. 6.

As next shown in FIG. 7 resist 25 is removed from the surface of filter 20 to lead the electrically conductive regions 28. This step may be accomplished using an appropriate solvent for the resist chosen. For example the Riston resist may be removed using acetone.

Figure 8:
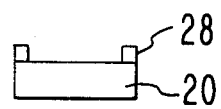
FIG. 8 is a subsequent cross-sectional view after division of the array of filters into individual filters.

As shown in FIG. 8 the array of filters 20 is then separated into individual filters using any well known technique. In the preferred embodiment the array of filters 20 is separated by scribing the filters and then breaking them apart. Depending upon the type of filter, however, sawing or laser cutting may also be used.

Figure 9:
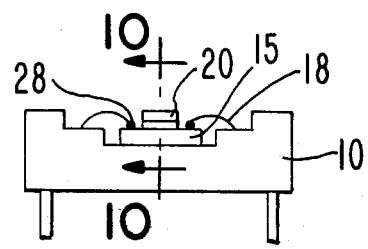
FIG. 9 is a cross-sectional view of an integrated circuit package showing how the filter of FIG. 8 may be mounted on the image sensor chip.

As shown in FIG. 9 filter 20 may be attached to the surface of sensor 15 using an desired technique, for example optical cement or epoxy. The effect of the electrically conductive material 28 is to space filter 20 away from chip 15 by the desired distance.

Figure 10:
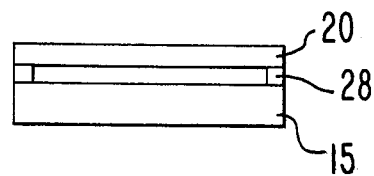
FIG. 10 is an expanded cross-sectional view of the structure shown in FIG. 9.

An expanded cross-sectional view of the structure shown in FIG. 9 appears at FIG. 10. This figure more clearly illustrates the spacing between filter 20 and sensor 15 caused by plated regions 28. Filter 20 is preferably attached to integrated circuit 15 between bonding pads 17.

This invention provides a method and structure by which precision spacers, providing a fixed optical distance between a semiconductor image sensing device and a filter, may be economically produced. The procedure utilizes known semiconductor metallurgical processes and circumvents the disadvantages inherent in prior art techniques. The invention is readily adaptable to batch processing, allows great flexibility in the format of the spacer and minimum tooling costs. The invention is particularly suitable for separating a filter for a charged coupled device from the device itself.

What is claimed is:
1. A process for fabricating spacers of a desired thickness for separating a filter from an underlying integrated circuit structure, comprising the steps of:
   forming a pattern of an electrically conductive material on one surface of the filter, the pattern being substantially thinner than the desired thickness;
   depositing a selected material over all of the filter except on the electrically conductive material, the selected material being deposited to substantially the desired thickness;
   depositing additional electrically conductive material on at least the pattern such that the pattern and the selected material cooperate to ensure that the electrically conductive material deposits substantially uniformly to the desired thickness; and
   removing the selected material.

2. A process as in claim 1 further including the step of attaching the filter to the underlying integrated circuit with the electrically conductive material separating the filter from the integrated circuit.

3. A process as in claim 1 wherein the step of forming a pattern comprises the steps of:
   depositing the electrically conductive material over all of the filter;
   forming a mask over the electrically conductive material; and
   removing the electrically conductive material except where covered by the mask.

4. A process as in claim 1 wherein the electrically conductive material comprises chromium.

5. A process as in claim 4 wherein the electrically conductive material comprises copper.

6. A process as in claim 4 wherein the electrically conductive material comprises gold.

7. A process as in claim 1 wherein the selected material comprises dry photoresist.

8. A process as in claim 1 wherein the step of depositing additional electrically conductive material comprises electroplating.

9. A process as in claim 1 wherein the underlying integrated circuit includes bonding pads, further comprising the step of forming the pattern to fit inside the bonding pads.

10. The process of claim 1 further including the step of forming the selected material to have a thickness of at least about 0.5 mil.

11. A process for fabricating a plurality of spacers of a predetermined thickness for separating a filter from an underlying integrated circuit structure, comprising the steps of:
   forming a grid of an electrically conductive material on one surface of the filter;
   depositing a dry film resist material over all of the filter to the predetermined thickness except on the grid of electrically conductive material;
   electroplating additional electrically conductive material on the grid; and
   using the grid of electrically conductive material during the electroplating step to ensure a uniform current density to form the electrically conductive material to be substantially the thickness of the dry film resist material.

12. The method of claim 11 further including the step of forming the dry resist material to a thickness of at least about 0.5 mil.

13. A process for forming an image sensing device including an integrated circuit having a plurality of bonding pads attached thereto and a filter, comprising the steps of:
   forming a grid of an electrically conductive material on one surface of a material suitable for forming an array of filters;

depositing a dry film resist material over all of the array except on the grid of electrically conductive material to the predetermined thickness;

electroplating additional electrically conductive material on the grid;

using the grid of electrically conductive material to ensure a uniform current density during the electroplating step to form the electrically conductive material to be substantially the thickness of the dry film resist material;

removing the dry film resist from the array;

dividing the array into a plurality of individual filters; and attaching a selected one of the individual filters to the integrated circuit.

14. The method of claim 13 further including the step of attaching the selected individual filter to the integrated circuit between the bonding pads.

* * * * *